US007684248B2

(12) United States Patent
Kwak

(10) Patent No.: US 7,684,248 B2
(45) Date of Patent: Mar. 23, 2010

(54) METHOD FOR MEASURING THRESHOLD VOLTAGE OF SONOS FLASH DEVICE

(75) Inventor: Sang-Hun Kwak, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 281 days.

(21) Appl. No.: 11/847,030

(22) Filed: Aug. 29, 2007

(65) Prior Publication Data

US 2008/0055975 A1    Mar. 6, 2008

(30) Foreign Application Priority Data

Sep. 1, 2006 (KR) ...................... 10-2006-0084163

(51) Int. Cl.
G11C 16/04 (2006.01)
(52) U.S. Cl. ........................... 365/185.18; 365/185.24; 365/185.28

(58) Field of Classification Search ............ 365/185.18, 365/185.24, 185.28
See application file for complete search history.

(56) References Cited

U.S. PATENT DOCUMENTS

| 6,097,639 | A | * | 8/2000 | Choi et al. | ............. 365/185.28 |
| 2007/0153586 | A1 | * | 7/2007 | Kwak | ................... 365/185.24 |

* cited by examiner

*Primary Examiner*—Gene N. Auduong
(74) *Attorney, Agent, or Firm*—Sherr & Vaughn PLLC

(57) ABSTRACT

Embodiments relate to a method for measuring a threshold voltage of a flash device including inputting a voltage and a pulse width. The dependence of threshold voltage on the applied voltages and the pulse width may be determined by using a threshold voltage measuring equation, and equations regarding a plurality of device variables included within the threshold voltage measuring equation.

10 Claims, 4 Drawing Sheets

METHOD FOR MEASURING THRESHOLD VOLTAGE OF SONOS FLASH DEVICE

The present application claims priority under 35 U.S.C. 119 to Korean Patent Application No. 10-2006-0084163, filed on Sep. 1, 2006, which is hereby incorporated by reference in its entirety.

BACKGROUND

An electrically rewritable nonvolatile memory device (EEPROM) is an example of a nonvolatile memory device where data is not erased when power is not applied. An EEPROM may use a floating gate structure. As semiconductor devices progress towards relatively high integration, there is a need to reduce the size of a floating gate cell. However, relatively high voltage may be required in programming and erasing operations. It may be difficult to secure process margins, and may be impossible to reduce the cell size. Nonvolatile memory devices substituting a floating gate cell, such as silicon-oxide-nitride-oxide-silicon (SONOS), FeRAM, SET, NROM, etc are being researched. Among them, the SONOS cell holds promise as a next-generation cell, substituting a stack-type floating gate cell.

However, there is no a method for measuring threshold voltage for the SONOS flash cell. The characteristics of the threshold voltage with respect to the pulse width and applied voltage can not be measured so that it may be difficult to account for them in the design of the SONOS flash cell.

SUMMARY

Embodiments relate to a method for measuring threshold voltage of a flash device. In particular, embodiments relate to a method for measuring the threshold voltage of a (SONOS) flash device as it relates to the voltage magnitude and pulse width. Embodiments relate to a method for measuring threshold voltage as it depends on the pulse widths and applied voltages, and applying the measurements to design a SONOS flash cell.

Embodiments relate to a method for measuring a threshold voltage of a flash device including inputting a voltage ($V_A$) and a pulse width ($W_P$). The dependence of threshold voltage ($V_{th}$) on the applied voltages ($V_A$) and the pulse width ($W_P$) may be determined by using a threshold voltage measuring equation, and equations regarding a plurality of device variables included within the threshold voltage measuring equation.

In embodiments, the voltages may be applied in a programming mode and an erasing mode. The threshold voltage measuring equation is as follows:

$$V_{th}(W_P, W_A) = \frac{dvth(V_A) - dvg(V_A)}{1 + \left(\frac{W_P}{x_0(V_A)}\right)^{p(V_A)}} + dvg(V_A)$$

And, the equations regarding the plurality of device variables are as follows:

$$dvth(V_A) = dvth0 \times (1 + vc1 \times V_A + vc2 \times V_A^2) \quad (1)$$

$$dvg(V_A) = dvg0 \times (1 + vc1 \times V_A + vc2 \times V_A^2) \quad (2)$$

$$x(V_A) = x0 \cdot \exp\left(\frac{vc1}{V_A}\right) \quad (3)$$

$$p(V_A) = p0 \times (1 + vc1 \times V_A + vc2 \times V_A^2). \quad (4)$$

DRAWINGS

Figure 1:
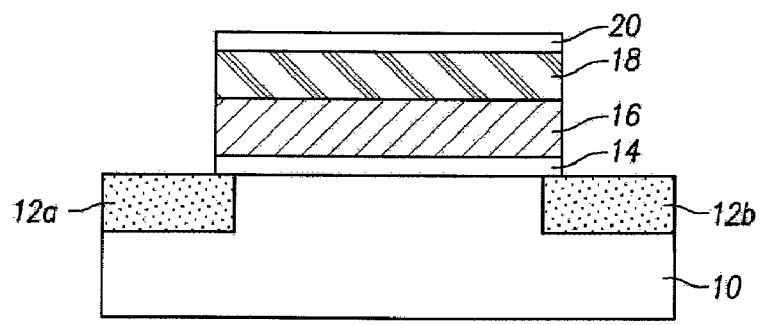

Example FIG. 1 is a cross-sectional view showing a structure of a unit cell of a SONOS structure.

Figure 2A:
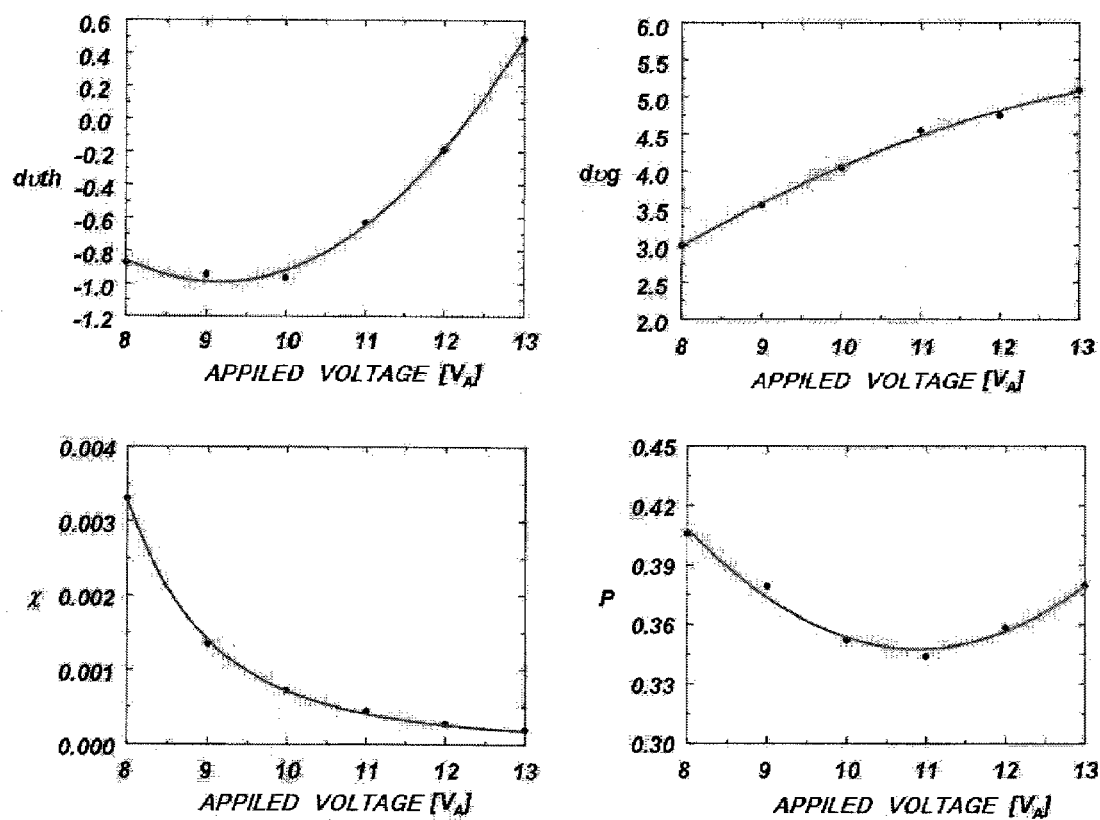

Example FIG. 2a is a graph detecting a variable value of a device of a programming state depending on applied voltages according to the embodiments.

Figure 2B:
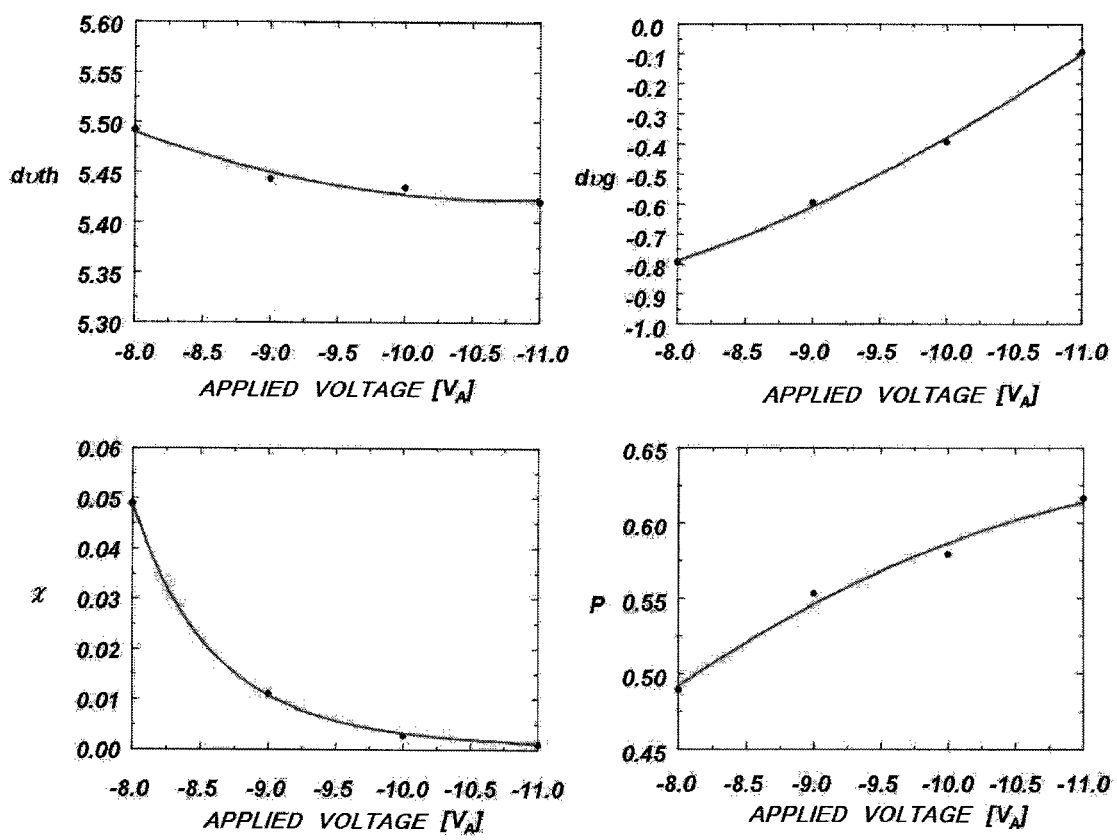

Example FIG. 2b is a graph detecting a variable value of a device of an erasing operation state depending on applied voltages according to the embodiments.

Figure 3:
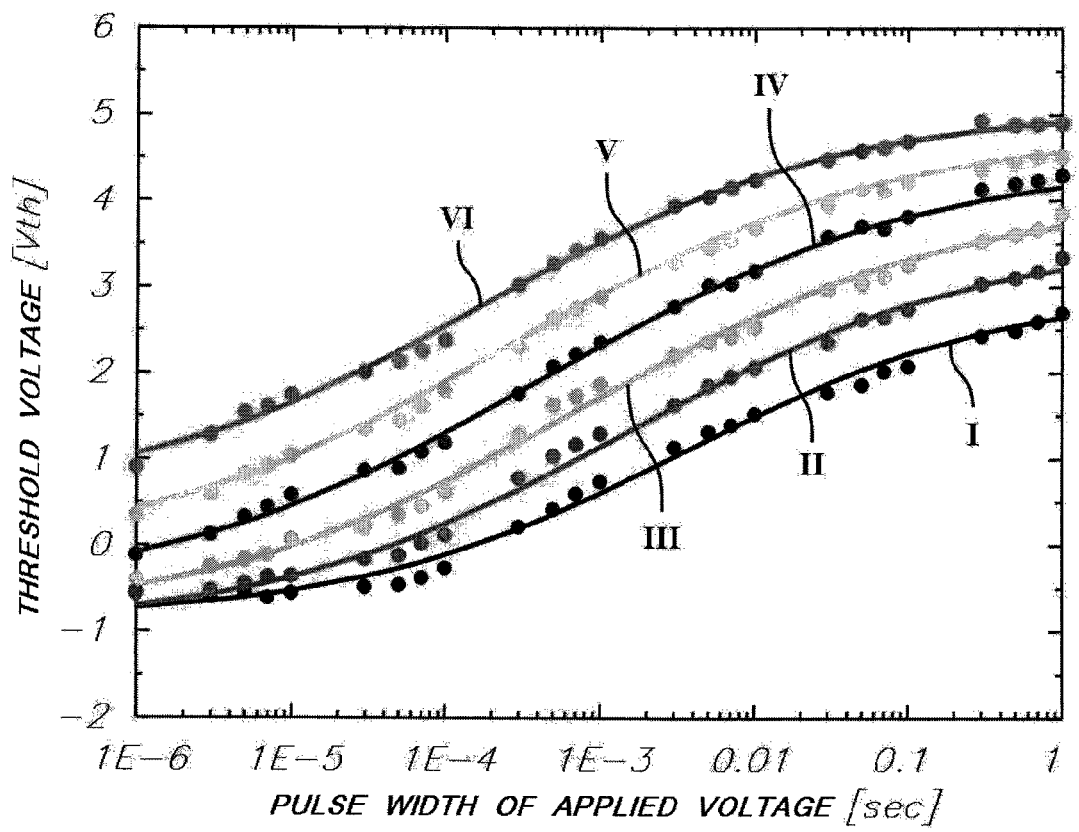

Example FIG. 3 is a graph showing threshold voltage of the programming state depending on applied voltages and the pulse widths of the applied voltages according to the present embodiments.

Figure 4:
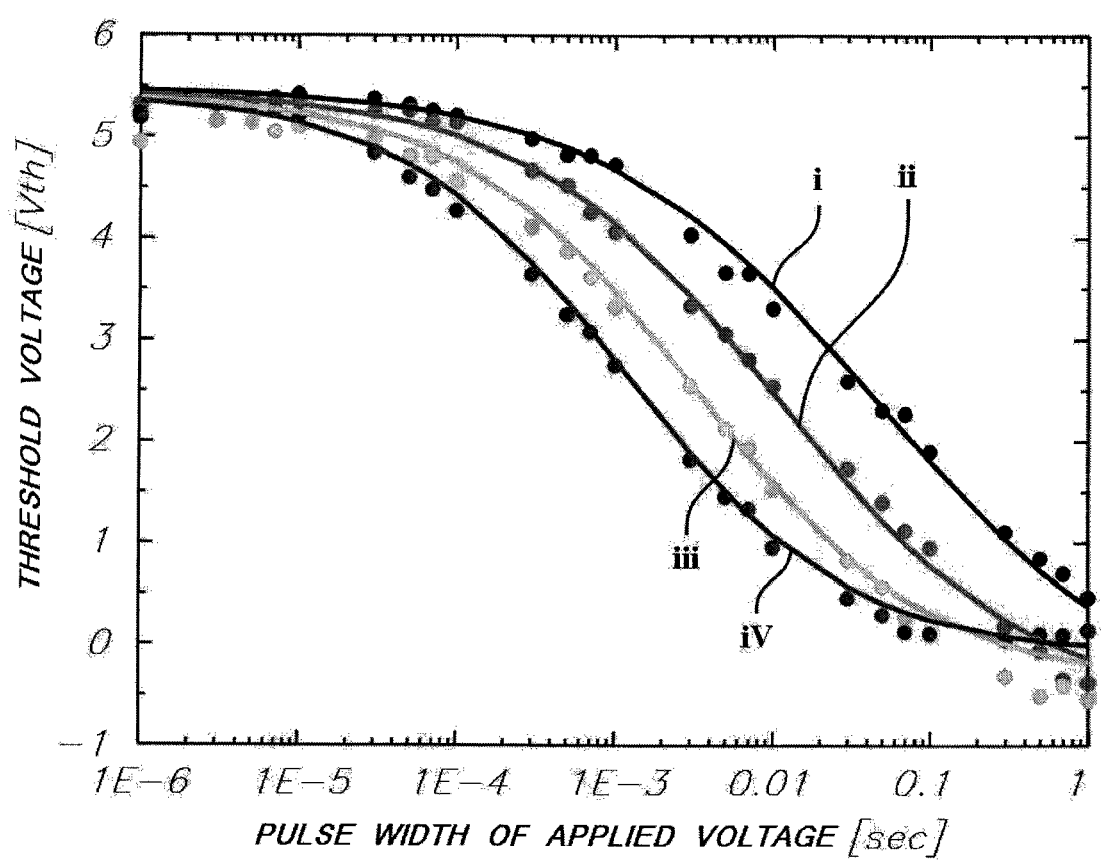

Example FIG. 4 is a graph showing threshold voltage of the erasing operation state depending on the applied voltages and the pulse widths of the applied voltages according to the present embodiments.

DESCRIPTION

Example FIG. 1 is a cross-sectional view showing a structure of a unit cell of a SONOS structure. A flash memory device with a SONOS structure according to embodiments may be constituted by an ONO film formed by stacking a first oxide film 14, a nitride film 16, and a second oxide film 18 over a P-type semiconductor substrate 10. A control gate 20 may be formed over the ONO film. Source/drain areas 12a and 12b may be formed by a high concentration of n-type impurities in the surface of the semiconductor substrate 10 on both sides of the control gate 20, as shown in the FIG. 1.

The first oxide film 14 is a tunneling oxide layer. The nitride film 16 functions as a memory by trapping charges in a trap area, or discharging the charges according to a control threshold voltage (Vth) applied to the cell. The second oxide film 18 is a blocking oxide layer preventing the loss of charge.

A flash memory device with a SONOS structure according to embodiments utilizes hot electron injection in a programming operation, and utilizes hot hole injection in an erasing operation. That is, in a programming mode, a predetermined positive (+) voltage is applied to the drain 12b and the control gate 20, and ground voltage is applied to the source area 12a and the semiconductor substrate 10.

When a bias is applied during programming, channel electrons are accelerated by the lateral electric field between the source 12a and drain 12b. Hot electrons are generated near the drain area 12b. These hot electrons tunnel through the potential barrier of the first oxide film 14. They become locally trapped in the nitride film 16 near the drain area 12b, thereby increasing the threshold voltage of the device. This is referred to as a channel hot electron injection.

In an erasing operation, a predetermined positive (+) voltage is applied to the drain area 12b, a predetermined negative (−) voltage is applied to the control gate 20, and ground is applied to the source area 12a and the semiconductor substrate 10.

When a bias is applied during an erase operation, a depletion area, which is a high concentration n-type impurity may form in the drain area 12b. This is caused by a high electric field in the overlap region between the drain area 12b and the control gate 20. An electron/hole pair may be created by band to band tunneling in the depletion area. The electrons escape to the high concentration n-type impurity area. The holes are accelerated by the lateral electric field to change into hot holes. These hot holes tunnel through the energy barrier between the first oxide film 14 and the semiconductor substrate 10. They are injected and trapped into the valence band of the nitride film 16, completing an erasing operation by lowering the threshold voltage. This erasing mode is referred to as hot hole injection.

Since threshold voltage is controlled by presence or absence of electrons in the nitride film 16, the respective thresholds for programming and erasing operations may be measured and modeled. It is therefore possible to design a flash memory device with the SONOS structure accordingly. To measure the threshold voltage, the voltages for the programming mode and the erasing mode of the SONOS cell transistor are determined. The threshold voltages (Vth) for each mode are also measured while increasing the pulse width (WP).

To program the SONOS cell transistor shown in embodiments, for example, from 8V to 13V may be used as the applied voltage, and 1 μS to 1 second may be used as the pulse width so that a measured value of the threshold voltage is secured. To erase the SONOS cell, −8V to −11V may be used as the applied voltage, and 1 μS~1 second may be used as the pulse width so that a measured value is secured.

The device variables for each pulse width (Wp) are obtained for magnitudes of the applied voltages (VA) by applying each of the measured threshold voltages to equation 1. Examples are listed in table 1.

$$V_{th}(W_P, V_A) = \frac{dvth(V_A) - dvg(V_A)}{1 + \left(\frac{W_P}{x_0(V_A)}\right)^{p(V_A)}} + dvg(V_A) \quad \text{Equation 1}$$

TABLE 1

|  |  | duth0 ($V_A$) | dug0 ($V_A$) | x0 ($V_A$) | p ($V_A$) |
|---|---|---|---|---|---|
|  | Applied Voltage (VA) |  |  |  |  |
| Programming Operation State | 8 V | −0.87268 | 2.99691 | 0.00331 | 0.40579 |
|  | 9 V | −0.94464 | 3.53629 | 0.00135 | 0.37908 |
|  | 10 V | −0.96379 | 4.04098 | 7.20E−04 | 0.35192 |
|  | 11 V | −0.63312 | 4.54896 | 4.50E−04 | 0.3438 |
|  | 12 V | −0.18818 | 4.74859 | 2.70E−04 | 0.35828 |
|  | 13 V | 0.48975 | 5.09118 | 1.90E−04 | 0.37954 |
|  | Applied voltage ($V_A$) |  |  |  |  |
| Erasing Operation State | −8 V | 5.49235 | −0.79475 | 0.04895 | 0.48936 |
|  | −9 V | 5.44291 | −0.59475 | 0.01106 | 0.55333 |
|  | −10 V | 5.43457 | −0.39321 | 0.0027 | 0.57908 |
|  | −11 V | 5.4206 | −0.09474 | 0.00104 | 0.61625 |

The device variables obtained at each voltage may be expressed by equations including the applied voltages, as follows.

$$dvth(V_A) = dvth0 \times (1 + vc1 \times V_A + vc2 \times V_A^2) \quad (1)$$

$$dvg(V_A) = dvg0 \times (1 + vc1 \times V_A + vc2 \times V_A^2) \quad (2)$$

$$x(V_A) = x0 \cdot \exp\left(\frac{vc1}{V_A}\right) \quad (3)$$

$$p(V_A) = p0 \times (1 + vc1 \times V_A + vc2 \times V_A^2) \quad (4)$$

If the values of the table 1 are applied in device variable equations (1) to (4) for the programming state, the values of each coefficient included in dvth(VA), dvg(VA), x(VA), and p(VA) can be derived as shown in a table 2. For an erasing operation, the values of each coefficient included in dvth(VA), dvg(VA), x(VA), and p(VA) be derived as shown in a table 3.

TABLE 2

|  | duth0 | vc1 | vc2 |
|---|---|---|---|
| duth ($V_A$) | 7.4020 | −0.2477 | 0.0135 |
|  | dug0 | vc1 | vc2 |
| dug ($V_A$) | −4.4491 | −0.2796 | 0.0088 |
|  | x0 | vc1 |  |
| x ($V_A$) | 1.5321E−06 | 61.3909 |  |
|  | p0 | vc1 | vc2 |
| p ($V_A$) | 1.2092 | −0.1308 | 0.0060 |

TABLE 3

|  | duth0 | vc1 | vc2 |
|---|---|---|---|
| duth ($V_A$) | 6.4492 | 0.0296 | 0.0014 |
|  | dug0 | vc1 | vc2 |
| dug ($V_A$) | −0.4649 | −0.5110 | −0.0530 |
|  | x0 | vc1 |  |
| x ($V_A$) | 5.8042E−08 | −109.1662 |  |
|  | dug0 | vc1 | vc2 |
| dug ($V_A$) | −0.4649 | −0.5110 | −0.0530 |
|  | p0 | vc1 | vc2 |
| p ($V_A$) | −0.4229 | 0.3971 | 0.0158 |

Accordingly, the values of the device variables obtained by the voltages described in Table 1 are indicated by points in the graph shown in example FIGS. 2a and 2b. These may be matched with the equations (1) to (4) regarding the device variables indicated by a solid line. Both states are determined according to the tunneling mechanism, so that the values of the device variables may be expressed by one model equation such as Equation 1. As described above, threshold voltages variations with the pulse width and the applied voltage in the programming and erasing modes may be measured with Equation 1.

Specifically, as shown in example FIG. 3, i For an applied programming voltage of 9V, variations of the threshold voltage with the pulse width are measured in graph II. For an applied programming voltage of 10V, variations of the threshold voltage with the pulse width are measured in graph III. For an applied programming voltage of 11V, variations of the threshold voltage with the pulse width are measured in graph IV. For an applied programming voltage of 12V, variations of the threshold voltage with the pulse width are measured in graph V. For an applied programming voltage of 13V, variations of the threshold voltage with the pulse width are measured in graph VI.

As shown in example FIG. 4, n the case where the applied voltage for the programming mode is −8V, variations in the threshold voltage depending on the pulse width of the applied voltage can be measured by means of a graph I. For an applied programming voltage of −9V, variations of the threshold voltage with the pulse width are measured in graph II. For an applied programming voltage of −10V, variations of the threshold voltage with the pulse width are measured in graph III. For an applied programming voltage of −11V, variations of the threshold voltage with the pulse width are measured in graph IV.

Accordingly, as the applied voltage and the pulse width are input according to embodiments, the threshold voltages of a flash device having a SONOS structure are simply measured using Equation 1. They may be used in designing a flash device having a SONOS structure. The measuring method simultaneously satisfies the detection of the threshold voltages according to the magnitude and pulse width of the applied voltage for the SONOS flash cell, thereby making it possible to increase the efficiency of the design.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
inputting a plurality of applied voltages and a plurality of pulse widths of the applied voltages; and
measuring a plurality of threshold voltages of a flash device according to the applied voltages and the pulse widths of the applied voltages by using a threshold voltage measuring equation comprising a plurality of device variables, and equations comprising said plurality of device variables included in said threshold voltage measuring equation.

2. The method of claim 1, wherein the applied voltages are applied in a programming mode and an erasing mode of the flash device.

3. The method of claim 1, wherein the threshold voltage measuring equation is as follows:

$$V_{th}(W_P, V_A) = \frac{dvth(V_A) - dvg(V_A)}{1 + \left(\frac{W_P}{x_0(V_A)}\right)^{p(V_A)}} + dvg(V_A)$$

and the equations comprising the plurality of the device variables are as follows:

$$dvth(V_A) = dvth0 \times (1 + vc1 \times V_A + vc2 \times V_A^2) \quad (1)$$

$$dvg(V_A) = dvg0 \times (1 + vc1 \times V_A + vc2 \times V_A^2) \quad (2)$$

$$x(V_A) = x0 \cdot \exp\left(\frac{vc1}{V_A}\right) \quad (3)$$

$$p(V_A) = p0 \times (1 + vc1 \times V_A + vc2 \times V_A^2), \quad (4)$$

wherein said $V_{th}$ is the threshold voltage, said $V_A$ is the applied voltage, said $W_p$ is the pulse widths of the applied voltage, wherein said dvth0, said dvg0, said x0, said p0, said vc1, and said vc2 are said plurality of device variables.

4. The method of claim 3, wherein the flash device is in a programming mode, and
in equation (1), vth0=7.4020, vc1=−0.2477, vc2=0.0135,
in equation (2), dvg0=−4.4491, vc1=−0.2796, vc2=0.0088,
in equation (3), x0=1.5321×10⁻⁶, vc1=61.3909, and
in equation (4), p0=1.2092, vc1=−0.1308, vc2=0.0060.

5. The method of claim 3, wherein the flash device is in an erasing mode, and
in equation (1), dvth0=6.4492, vc1=0.0296, vc2=0.0014,
in equation (2), dvg0=−0.4649, vc1=−0.5110, vc2=−0.0530,
in equation (3), x0=5.8042×10⁻⁸, vc1=−109.1662, and
in equation (4), p0=−0.4229, vc1=0.3971, vc2=0.0158.

6. An apparatus configured to:
input a plurality of applied voltages and a plurality of pulse widths of the applied voltages; and
measure a plurality of threshold voltages of a flash device according to the applied voltages and the pulse widths of the applied voltages by using a threshold voltage measuring equation comprising a plurality of device variables, and equations comprising said plurality of device variables included in said threshold voltage measuring equation.

7. The apparatus of claim 6, wherein the applied voltages are applied in a programming mode and an erasing mode of the flash device.

8. The apparatus of claim 6, wherein the threshold voltage measuring equation is as follows:

$$V_{th}(W_P, V_A) = \frac{dvth(V_A) - dvg(V_A)}{1 + \left(\frac{W_P}{x_0(V_A)}\right)^{p(V_A)}} + dvg(V_A)$$

and the equations comprising the plurality of the device variables are as follows:

$$dvth(V_A) = dvth0 \times (1 + vc1 \times V_A + vc2 \times V_A^2) \quad (1)$$

$$dvg(V_A) = dvg0 \times (1 + vc1 \times V_A + vc2 \times V_A^2) \quad (2)$$

$$x(V_A) = x0 \cdot \exp\left(\frac{vc1}{V_A}\right) \quad (3)$$

$$p(V_A) = p0 \times (1 + vc1 \times V_A + vc2 \times V_A^2), \quad (4)$$

wherein said $V_{th}$ is the threshold voltage, said $V_A$ is the applied voltage, said $W_p$ is the pulse widths of the applied voltage, wherein said dvth0, said dvg0, said x0, said p0, said vc1, and said vc2 are said plurality of device variables.

9. The apparatus of claim 8, wherein the flash device is in a programming mode, and in equation (1), vth0=7.4020, vc1=−0.2477, vc2=0.0135,
in equation (2), dvg0=−4.4491, vc1=−0.2796, vc2=0.0088,
in equation (3), x0=1.5321×10$^{-6}$, vc1=61.3909, and
in equation (4), p0=1.2092, vc1=−0.1308, vc2=0.0060.

10. The apparatus of claim 8, wherein the flash device is in an erasing mode, and in equation (1), dvth0=6.4492, vc1=0.0296, vc2=0.0014,
in equation (2), dvg0=−0.4649, vc1=0.5110, vc2=−0.0530,
in equation (3), x0=5.8042×10$^{-8}$, vc1=−109.1662, and
in equation (4), p0=−0.4229, vc1=0.3971, vc2=0.0158.

\* \* \* \* \*